United States Patent
Odry et al.

(10) Patent No.: US 10,753,997 B2
(45) Date of Patent: Aug. 25, 2020

(54) IMAGE STANDARDIZATION USING GENERATIVE ADVERSARIAL NETWORKS

(71) Applicant: Siemens Healthcare GmbH, Erlangen (DE)

(72) Inventors: Benjamin L. Odry, West New York, NJ (US); Boris Mailhe, Plainsboro, NJ (US); Mariappan S. Nadar, Plainsboro, NJ (US); Pascal Ceccaldi, Princeton, NJ (US)

(73) Assignee: Siemens Healthcare GmbH, Erlangen (DE)

( * ) Notice: Subject to any disclaimer, the term of this patent is extended or adjusted under 35 U.S.C. 154(b) by 63 days.

(21) Appl. No.: 16/054,319

(22) Filed: Aug. 3, 2018

(65) Prior Publication Data

US 2019/0049540 A1  Feb. 14, 2019

Related U.S. Application Data

(60) Provisional application No. 62/543,571, filed on Aug. 10, 2017.

(51) Int. Cl.
*G06N 3/04* (2006.01)
*G01R 33/56* (2006.01)
*G01R 33/54* (2006.01)
*G06N 3/08* (2006.01)

(52) U.S. Cl.
CPC ....... *G01R 33/5608* (2013.01); *G01R 33/543* (2013.01); *G06N 3/0454* (2013.01); *G06N 3/0472* (2013.01); *G06N 3/084* (2013.01)

(58) Field of Classification Search
CPC ................. G06N 3/08–088; G06N 3/02–049

USPC .......................................................... 324/309
See application file for complete search history.

(56) References Cited

U.S. PATENT DOCUMENTS

| | | | | |
|---|---|---|---|---|
| 8,949,082 | B2* | 2/2015 | Farooq | G06Q 10/10 703/2 |
| 9,968,257 | B1* | 5/2018 | Burt | A61B 5/7267 |
| 10,346,974 | B2* | 7/2019 | Sloan | G01R 33/5602 |
| 10,521,902 | B2* | 12/2019 | Avendi | G06T 7/0012 |
| 2009/0187522 | A1* | 7/2009 | Fung | G06F 21/6254 706/46 |
| 2015/0260819 | A1* | 9/2015 | Lauer | G01R 33/5608 600/420 |

(Continued)

OTHER PUBLICATIONS

Arjovsky, Martin, Soumith Chintala, and Léon Bottou. "Wasserstein gan." arXiv preprint arXiv:1701.07875, pp. 1-32 (2017).

(Continued)

*Primary Examiner* — Patrick Assouad
*Assistant Examiner* — Demetrius R Pretlow

(57) ABSTRACT

Systems and methods are provided for synthesizing protocol independent magnetic resonance images. A patient is scanned by a magnetic resonance imaging system to acquire magnetic resonance data. The magnetic resonance data is input to a machine learnt generator network trained to extract features from input magnetic resonance data and synthesize protocol independent images using the extracted features. The machine learnt generator network generates a protocol independent segmented magnetic resonance image from the input magnetic resonance data. The protocol independent magnetic resonance image is displayed.

5 Claims, 8 Drawing Sheets

(56) References Cited

U.S. PATENT DOCUMENTS

| | | | | |
|---|---|---|---|---|
| 2016/0133037 A1* | 5/2016 | Vemulapalli | ............ | G06T 11/60 |
| | | | | 382/128 |
| 2017/0100078 A1* | 4/2017 | Han | ........................ | G16H 50/50 |
| 2017/0356976 A1* | 12/2017 | Shapiro | ................ | G06K 9/6273 |
| 2018/0099152 A1* | 4/2018 | Nioutsikou | ............ | G06T 7/0014 |
| 2018/0143275 A1* | 5/2018 | Sofka | .................... | G06T 7/0012 |
| 2018/0203081 A1* | 7/2018 | Cohen | ................ | G01R 33/4828 |
| 2018/0240235 A1* | 8/2018 | Mazo | .................... | G16H 50/50 |
| 2018/0259608 A1* | 9/2018 | Golden | .................. | G06N 3/084 |
| 2018/0336677 A1* | 11/2018 | Sloan | .................... | G06T 7/0012 |
| 2019/0311506 A1* | 10/2019 | Wenzel | .................... | G06T 5/006 |
| 2019/0362522 A1* | 11/2019 | Han | ...................... | A61B 5/7267 |
| 2019/0370965 A1* | 12/2019 | Lay | ........................ | G06T 7/0012 |
| 2020/0003857 A1* | 1/2020 | Weese | ................ | G01R 33/4828 |

OTHER PUBLICATIONS

Arora, Sanjeev, et al. "Generalization and equilibrium in generative adversarial nets (gans)." arXiv preprint arXiv:1703.00573, pp. 1-27 (2017).

Ganin, Yaroslav, et al. "Domain-adversarial training of neural networks." The Journal of Machine Learning Research 17.1 (2016) pp. 1-35.

Gulrajani, Ishaan, et al. "Improved training of wasserstein gans." Advances in Neural Information Processing Systems., pp. 1-11, 2017.

Madabhushi, Anant, and Jayaram K. Udupa. "New methods of MR image intensity standardization via generalized scale." Medical Physics 33.9 (2006): 3426-3434.

Radford, Alec, Luke Metz, and Soumith Chintala. "Unsupervised representation learning with deep convolutional generative adversarial networks." arXiv preprint arXiv:1511.06434, pp. 1-16 (2015).

* cited by examiner

IMAGE STANDARDIZATION USING GENERATIVE ADVERSARIAL NETWORKS

CROSS REFERENCE TO RELATED APPLICATIONS

This application claims the benefit of U.S. Provisional Application No. 62/543,571 filed Aug. 10, 2017 which is hereby incorporated by reference in its entirety.

FIELD

The present embodiments relate to medical image processing.

BACKGROUND

Medical image standardization may have many applications. For example, medical image standardization may provide normalized input data for quantification algorithms, database homogeneity, and/or homogenous visualization. Medical image standardization, however, may be an issue for magnetic resonance imaging. Because of, but not only, the sheer number of parameters that are involved in MR acquisition, the same sequence/protocol may provide different outputs significantly vary between the same scanner model at different institutions, between vendors etc. Since the intensity distribution is changed, it makes quantification algorithms very dependent on acquisition parameters, institutions, and/or protocols.

The results are often unequal due to the variations in acquired data, for example, a level of brightness depending on the sequence and the protocol the input data was acquired in. In an example, the results of segmentation by two physicians may differ because of the differences in the physician's training in MRI data acquisition. Different machines, different sequences, or different settings may provide different intensities. Different environmental conditions may lead to different results even from the same machine or patient from scan to scan.

SUMMARY

By way of introduction, the preferred embodiments described below include methods and systems for providing image standardization for medical images. An adversarial network is used to learn domain invariant features for a clean data representation in a latent space. From the representation, a synthetic data is generated that match anatomical structures of the original input but within the same common distribution, without the differences generated by institutions/scanner calibration.

In a first aspect, a method is provided for synthesizing protocol independent magnetic resonance images in a magnetic resonance imaging system. A patient is scanned by the magnetic resonance imaging system to acquire magnetic resonance data. The magnetic resonance data is input to a machine learnt generator network trained to extract features from input magnetic resonance data and synthesize protocol independent images using the extracted features. The machine learnt generator network generates a protocol independent segmented magnetic resonance image from the input magnetic resonance data. The protocol independent magnetic resonance image is displayed.

In a second aspect, a method is provided for training a generator neural network to output segmented MR images. First data acquired from an MRI system is input into an independent encoder network of the generator neural network. The independent encoder network is configured to generate a latent space that represents a compact version of the first data. The latent space is input into a discriminator network. The discriminator network is configured to classify the latent space as acquired from a first domain or second domain. The discriminator network calculates a value based on a loss function for the classification. The independent encoder network is adjusted as a function of the value. Inputting, inputting, calculating, and adjusting are repeated until a training loss converges.

In a third aspect, a system is provided for generating domain independent magnetic resonance images. The system includes a magnetic resonance system, an encoder network, a plurality of decoder networks, a memory, an image processor, and a display. The magnetic resonance system is configured to acquire magnetic resonance data for a patient. The encoder network is trained with a discriminator network and a critic function to generate domain independent feature data. The plurality of decoder networks are each trained to generate a synthetic image for a modality. The memory is configured to store the encoder network and the plurality of independent decoder networks as trained. The image processor is configured to select a decoder network for a modality from the plurality of decoder networks. The image processor is further configured to input the magnetic resonance data into the encoder network and receive an output synthetic image from the decoder network. The display is configured to display the output synthetic image.

The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION

Discrepancies intra-protocol are numerous because of the complexity of an MR acquisition. A deep learning generative network is provided that learns to identify domain invariant features. The deep learning generative network provides a clean data representation in a latent space. From the representation, synthetic data is generated that match anatomical structures of the original input but within the same common distribution, without the differences generated by institutions/scanner calibration etc.

For the deep learning generative network, a deep fully convolutional dense network is trained with domain adaptation to minimize the discrepancies. The training of domain adaptation uses adversarial training. In adversarial training, a discriminative network is used to enhance the primary network. The primary network may be generative (segmentation, synthesis) or discriminative (classification). Domains may be represented by the same protocols from different institutions.

Figure 1:
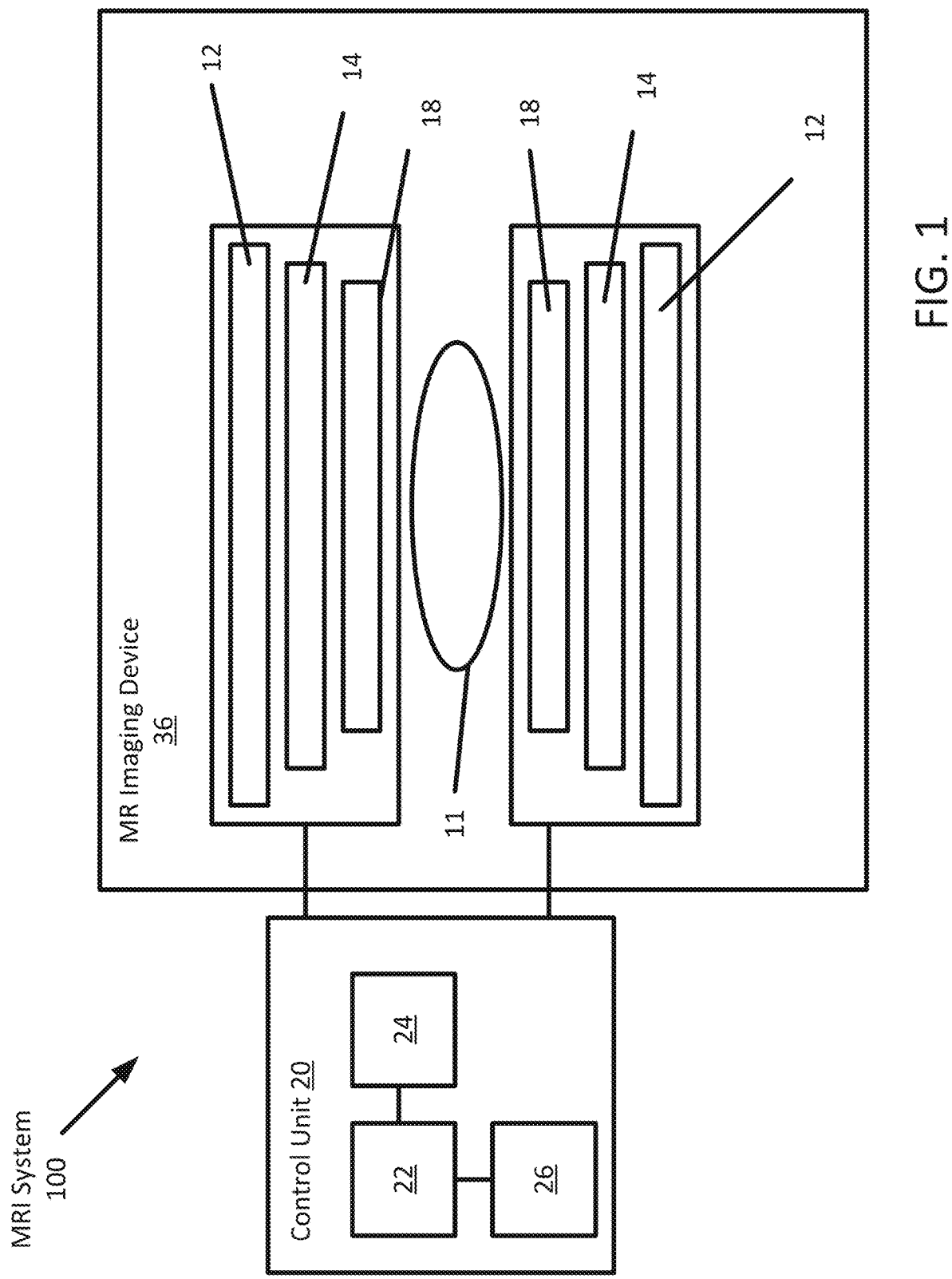
FIG. 1 depicts an example MRI system.

FIG. 1 depicts an MRI system 100 for acquisition of frequency domain components representing Magnetic Resonance (MR) image data for storage in a storage array. The MRI system 100 includes a control unit 20 that is configured to process the MR signals and generate images of the body for display to an operator. The control unit 20 may store the MR signals and images for later processing or viewing in a memory 24. The control unit 20 may include a display 26 for presentation of images to an operator. The MR scanning system 100 is only exemplary, and a variety of MR scanning systems may be used to collect the MR data.

In the MRI system 100, magnetic coils 12 create a static base or main magnetic field in the body of patient 11 or an object positioned on a table and imaged. Within the magnet system are gradient coils 14 for producing position dependent magnetic field gradients superimposed on the static magnetic field. Gradient coils 14, in response to gradient signals supplied thereto by a gradient and control unit 20, produce position dependent and shimmed magnetic field gradients in three orthogonal directions and generate magnetic field pulse sequences. The shimmed gradients compensate for inhomogeneity and variability in an MR imaging device magnetic field resulting from patient anatomical variation and other sources.

The control unit 20 may include a RF (radio frequency) module that provides RF pulse signals to RF coil 18, which produces magnetic field pulses that rotate the spins of the protons in the imaged body of the patient 11 by ninety degrees or by one hundred and eighty degrees for so-called "spin echo" imaging, or by angles less than or equal to 90 degrees for "gradient echo" imaging. Gradient and shim coil control modules in conjunction with RF module, as directed by control unit 20, control slice-selection, phase-encoding, readout gradient magnetic fields, radio frequency transmission, and magnetic resonance signal detection, to acquire magnetic resonance signals representing planar slices of the patient 11.

In response to applied RF pulse signals, the RF coil 18 receives MR signals, e.g. signals from the excited protons within the body as the protons return to an equilibrium position established by the static and gradient magnetic fields. The MR signals are detected and processed by a detector within RF module and the control unit 20 to provide an MR dataset to an image data processor 22 for processing into an image. In some embodiments, the image data processor 22 is located in the control unit 20, in other embodiments, the image data processor 22 is located remotely. A two or three-dimensional k-space storage array of individual data elements in a memory 24 of the control unit 20 stores corresponding individual frequency components including an MR dataset. The k-space array of individual data elements includes a designated center, and individual data elements individually include a radius to the designated center.

A magnetic field generator (including coils 12, 14 and 18) generates a magnetic field for use in acquiring multiple individual frequency components corresponding to individual data elements in the storage array. The individual frequency components are successively acquired using a Cartesian acquisition strategy as the multiple individual frequency components are sequentially acquired during acquisition of an MR dataset. A storage processor in the control unit 20 stores individual frequency components acquired using the magnetic field in corresponding individual data elements in the array. The row and/or column of corresponding individual data elements alternately increases and decreases as multiple sequential individual frequency components are acquired. The magnetic field acquires individual frequency components in an order corresponding to a sequence of substantially adjacent individual data elements in the array, and magnetic field gradient change between successively acquired frequency components is substantially minimized.

Imaging data for MR may be defined by two different relaxation times—T1 and T2. T1 (longitudinal relaxation time) is the time constant that determines the rate at which excited protons return to equilibrium (e.g. a measure of the time taken for spinning protons to realign with the external magnetic field). T2 (transverse relaxation time) is the time constant that determines the rate at which excited protons reach equilibrium or go out of phase with each other. T2 is a measure of the time taken for spinning protons to lose phase coherence among the nuclei spinning perpendicular to the main field.

Three common MRI sequences used are T1-weighted, T2-weighted, and FLAIR (Fluid Attenuated Inversion Recovery). Other sequence may also be used. T1-weighted images are produced by using short TE and TR times. The contrast and brightness of the image are predominately determined by T1 properties of tissue. Conversely, T2-weighted images are produced by using longer TE and TR times. In the images, the contrast and brightness are predominately determined by the T2 properties of tissue. The Flair sequence is similar to a T2-weighted image except that the TE and TR times are very long. By doing so, abnormalities remain bright but normal CSF fluid is attenuated and made dark.

Variations in MRI acquisition protocols and machinery result in different appearances of tissue in acquired image data. Image intensities in MRI do not have a fixed meaning, even within the same protocol for the same body region obtained on the same scanner for the same patient. The variations between scans, scanner, protocols, etc. present issues in image display, segmentation, and quantification. Each different sequence provides different image results. For example, the brightness of tissues is different for each sequence. In addition to different MRI sequences, differences between different systems may also generate different image data. An MRI system from a first manufacturer may provide slightly different results than an MRI system from a second manufacturer. Even among similar machines, results may vary due to degradation over time, technician preferences, and environmental conditions among other factors.

Due to the differences in different domains with different sequences, settings, environments, technicians, and other factors, different outcomes may be generated by different MRI domains. The differences in output images may lead to poor diagnostics. Different outcomes from different domains may prohibit accurate image processing.

Embodiments provide a machine learnt network to identify the differences between domains and therefore retain features that are specific to the task and independent from the protocols. The disclosed machine learnt networks may be implemented to computationally facilitate processing of medical imaging data and consequently improving and optimizing medical diagnostics.

Figure 2:
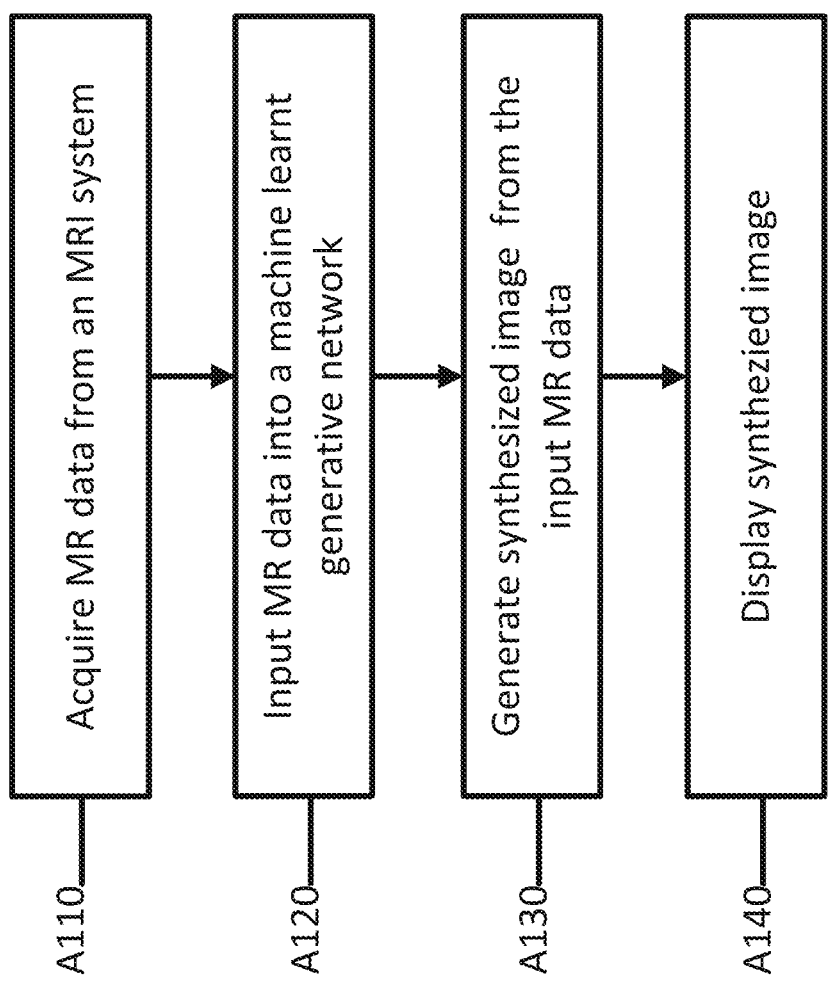
FIG. 2 depicts a method for providing domain independent image processing for a magnetic resonance imaging system according to an embodiment.

FIG. 2 depicts an example method for synthesizing protocol independent magnetic resonance images in a magnetic resonance imaging system. The acts are performed by the system of FIG. 1, FIG. 5, FIG. 8, other systems, a workstation, a computer, and/or a server. Additional, different, or fewer acts may be provided. For example, for segmentation, an initialization act may be performed prior to inputting the MR data. A smoothing act may be performed after the data 439 is output. The machine learnt networks may be trained, e.g. configured, prior to the method of FIG. 3. The acts are performed in the order shown (e.g., top to bottom) or other orders.

At act A110, an object is scanned by the magnetic resonance imaging system to acquire MR data. As depicted and described in FIG. 1 above, the MR data may be acquired using MR scanners. For example, gradient coils, a whole-body coil, and/or local coils generate a pulse or scan sequence in a magnetic field created by a main magnet or coil. The whole-body coil or local coils receive signals responsive to the re-orientation of molecules shifted due to the scan sequence. In an embodiment and used as an example below, the MR data may represent image data for a brain of a patient. Different objects, organs, or regions of a patient may also be scanned.

The MR data is k-space data or image data. Image data is MR data after Fourier transform into object space. The image data may be at any point after transform, so may be scalar values. The MR data may be scan data to be used to generate an image on a display. The acquired MR data may be data being processed to generate an image, data formatted for display, or data that has been used to display. The MR data may be data with no or some image processing.

The MR data may represent volumes. Three-dimensional datasets are obtained. As k-space data, information content may be provided that is responsive to a three-dimensional distribution of locations, but the data itself does not directly represent the locations prior to transform. In alternative embodiments, two-dimensional datasets representing or responsive to tissue in planes are obtained. In other embodiments, sequences of MR data responsive to the same tissue over time are acquired for training.

Alternative methods may be used to acquire the MR data. The MR data may be acquired remotely from the server or workstation or may be acquired at a different time, for example, hours or days prior to the processing provided below in Acts A120-A140. The MR data may be stored locally onsite or offsite, for example in the cloud.

At act A120, the MR data is input to a machine learnt generator network trained to extract features from input magnetic resonance data and synthesize protocol independent images using the extracted features. For the machine learnt generator network, an autoencoder architecture is used that includes two parts, an encoder and a decoder. The encoder and decoder are independent from one another and may be swapped out with other encoders and decoders depending on the input data and the desired output. An independent encoder learns the optimal representation of data from a source modality, under the form of a latent space, and an independent decoder, uses the latent space to generate a synthetic image (or segmentation).

Encoders are provided for each modality. Each of the encoders may be configured as a fully convolutional dense network. Each of the encoders include dense blocks of multiple convolutional layers. Early layers are connected to the next ones within dense blocks. Max or Average Pooling layer follows each dense block to further reduce the scale and advance in the abstract representation of the source data. The number of convolutional layers per dense block may vary depending on the complexity or the source database, as does the number of dense blocks in the encoder, or decoder. The last layer of the encoder defines the latent space, where the representation of the data lays in. Inputs to this encoder are source data. The source data may be uni-parametric (CT, PET). Alternatively, or additionally, one latent space may represent a standard protocol with multiple sequences (T1w, T2w, FLAIR, Fat, water, in-/opp-phase maps, Diffusion weighted, Perfusion Weighted).

Figure 3:
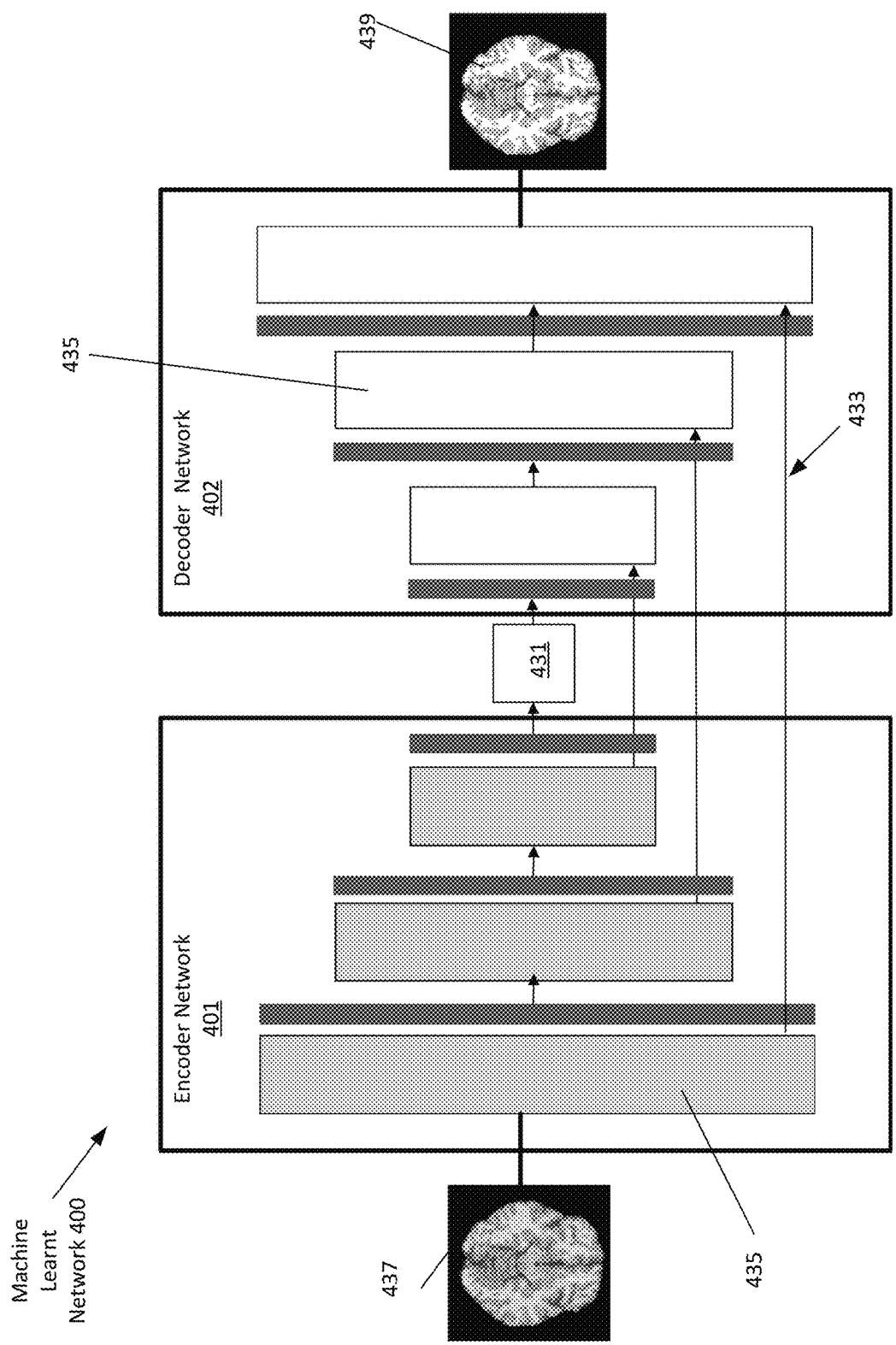
FIG. 3 depicts a machine learnt generator network according to an embodiment.

FIG. 3 depicts an example machine learnt network 400. The machine learnt network 400 is defined as a plurality of sequential feature units or layers 435. The machine network inputs MR data 437 (here depicted as an image) and outputs a synthesized image 439. The machine learnt network 400 includes an encoder 401 and a decoder 402. The encoder 401 and decoder each include layers 435 that encode or decode respectfully. Sequential is used to indicate the general flow of output feature values from one layer 435 to input to a next layer 435. The information from the next layer 435 is fed to a next layer 435, and so on until the final output. The layers may only feed forward or may be bi-directional, including some feedback to a previous layer 435. The nodes of each layer 435 or unit may connect with all or only a sub-set of nodes of a previous and/or subsequent layer 435 or unit. Skip connections 433 may be used, such as a layer 435 outputting to the sequentially next layer 435 as well as other layers.

Various units or layers may be used, such as convolutional, pooling (e.g., max pooling), deconvolutional, fully connected, or other types of layers. Within a unit or layer 435, any number of nodes is provided. For example, 100 nodes are provided. Later or subsequent units may have more, fewer, or the same number of nodes. In general, for convolution, subsequent units have more abstraction. For example, the first unit provides features from the image, such as one node or feature being a line found in the image. The next unit combines lines, so that one of the nodes is a corner. The next unit may combine features (e.g., the corner and length of lines) from a previous unit so that the node provides a shape indication. For transposed-convolution to reconstruct, the level of abstraction reverses. Each unit or layer 435 in the encoder 401 increases the level of abstraction or compression while each unit or layer 435 in the decoder decreases the level of abstraction.

The generator network may further be configured as a sequence of an encoder network 401 and a corresponding decoder network. Each encoder layer 435 has a corresponding decoder layer 435. The final decoder output is fed to a classifier to produce class probabilities for each pixel independently. Each encoder 401 in the encoder network 401 performs convolution with a filter bank to produce a set of feature maps. The decoder network 402 up samples input feature maps using the memorized max-pooling indices from the corresponding encoder feature maps producing sparse feature maps. The sparse feature maps are then convolved with a decoder to produce dense feature maps. A batch normalization step is then applied to each of the maps.

The high dimensional feature representation at the output of the final decoder is input to a classifier which classifies each pixel independently. The output of the classifier is a X channel image of probabilities where X is the number of classes. The predicted image corresponds to the class with maximum probability at each pixel.

The network may be a DenseNet. The DenseNet connects each layer to every other layer 435 in a feed-forward fashion. For each layer 435 in the DenseNet, the feature-maps of all preceding layers are used as inputs, and the output feature-map of that layer 435 is used as input into all subsequent layers. In the DenseNet, for each layer 435, the feature maps of all preceding layers are used as inputs, and its own feature maps are used as inputs into all subsequent layers. To reduce the size of the network, the DenseNet may include transition layers. The layers include convolution followed by average or maximum pooling. The transition layers reduce height and width dimensions but leave the feature dimension the same. The machine learnt generator network may further be configured as a U-net. The U-Net is an auto-encoder in which the outputs from the encoder-half of the network are concatenated with the mirrored counterparts in the decoder-half of the network. The skip connections 433 prevent the middle of the network from becoming a bottleneck.

Other network arrangements may be used, such as a support vector machine. Deep architectures include convolutional neural network (CNN) or deep belief nets (DBN), but other deep networks may be used. CNN learns feed-forward mapping functions while DBN learns a generative model of data. In addition, CNN uses shared weights for all local regions while DBN is a fully connected network (e.g., including different weights for all regions of an image). The training of CNN is entirely discriminative through back-propagation. DBN, on the other hand, employs the layer-wise unsupervised training (e.g., pre-training) followed by the discriminative refinement with back-propagation if necessary. In an embodiment, the arrangement of the machine learnt network is a fully convolutional network (FCN). Alternative network arrangements may be used, for example, a 3D Very Deep Convolutional Networks (3D-VGGNet). VGGNet stacks many layer blocks containing narrow convolutional layers followed by max pooling layers. A 3D Deep Residual Networks (3D-ResNet) architecture may be used. A Resnet uses residual blocks and skip connections to learn residual mapping.

Figure 4:
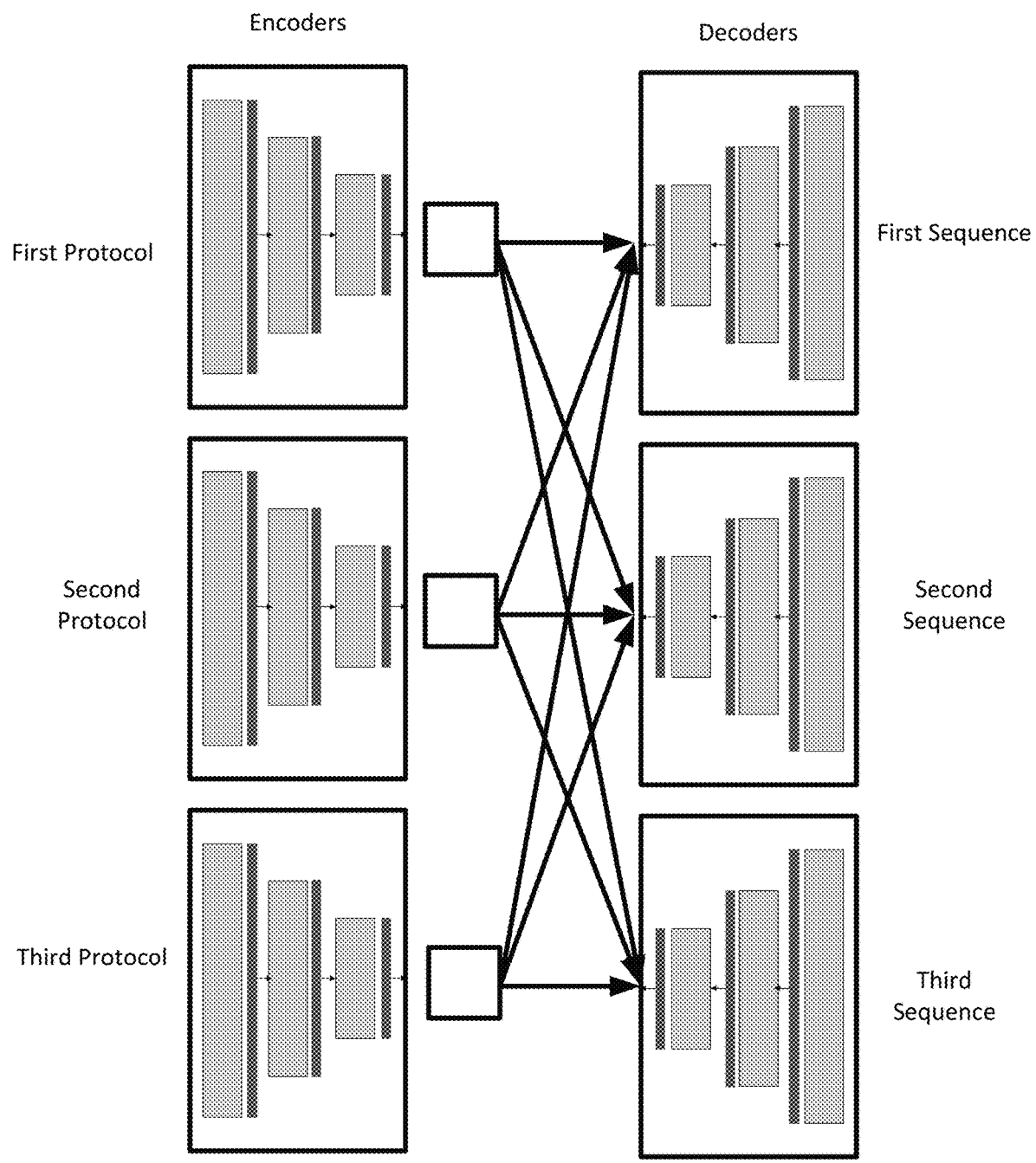
FIG. 4 depicts a plurality of interchangeable encoder and decoder networks according to an embodiment.

In an embodiment, the machine learnt generator network includes an independent encoder configured to generate a modality latent space 431 for the input magnetic resonance data and an independent decoder configured to synthesize the protocol independent image from the modality latent space 431. FIG. 4 depicts a plurality of independent encoders and independent decoders. Each encoder may be trained to input a specific protocol. Each decoder may be trained to generate a sequence specific output given a latent space 431 from any of the encoders. The output of each of the encoders is a latent space 431 that is specific to the domain, for example, to a protocol. Each decoder may use the latent space 431 to generate a modality specific output, e.g. T1, T2, FLAIR, etc.

Figure 5:
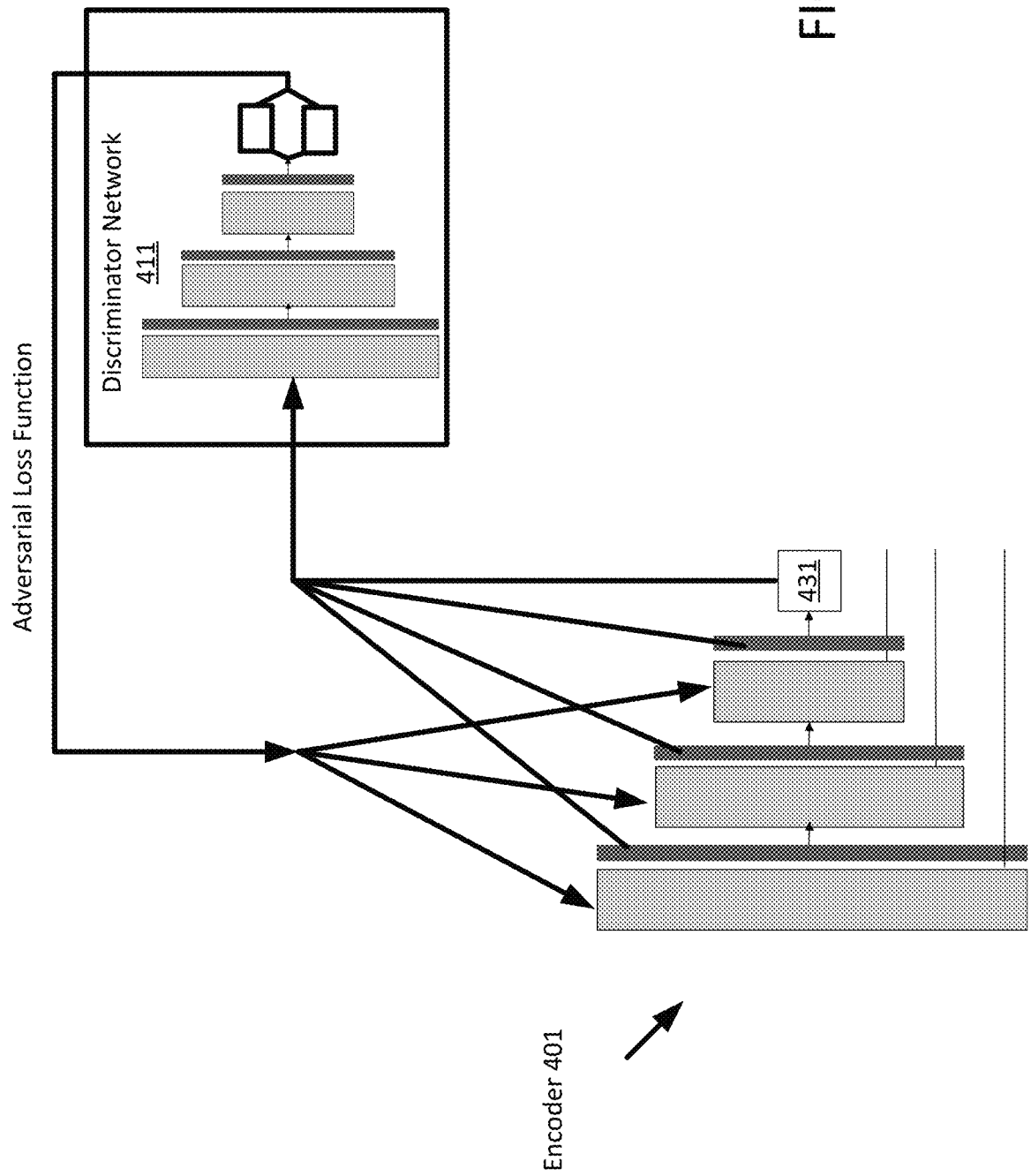
FIG. 5 depicts a diagram for training an encoder network for domain adaptation according to an embodiment.

In an embodiment, for domain adaptation, the independent encoder is trained using a loss function that is calculated as a function of a value from a loss function provided by a first adversarial learnt network trained to classify concatenated features from the modality latent space 431 as either from a first protocol or a second protocol. A protocol robust encoding mechanism is provided by using an adversarial network. Encoding features that are invariant to protocols are learned using the adversarial network. At each dense block output of the encoder network 401, features are concatenated to be used in a discriminator network whose purpose is to correctly classify which protocol the training data is from. The result of the training by the adversarial network is an encoder network 401 that generates a protocol independent latent space 431. FIG. 5 depicts an example of an adversarial training process for the encoder.

FIG. 5 depicts the encoder network 401 and a discriminator network 411. The inputs, e.g. training data, for the adversarial network are the MR data from two different protocols, e.g. a first and second protocol. The encoder network 401 inputs the MR data and generates a feature map as described above. The encoder network 401 may generate features maps at each level including the output latent space 431. The features data (e.g. maps, latent space 431) is input into the discriminator network 411 which attempts to discern from which protocol the features maps were generated from. The discriminator network 411 classifies feature data as either from one protocol or another and then provides feedback for the encoder network 401. In the adversarial process, the encoder network 401 may be trained to minimize the sum of two losses: a supervised L1 distance of the encoder prediction $E\{x,y\}$ $\|y-G(x)\|L1$, and an unsupervised adversarial term $E\{x\}$ $D(G(x))$. The adversarial term is provided by the discriminator network 411. While the encoder network 401 is being trained, the discriminator network 411 is also adjusted to provide better feedback to the encoder network 401.

Figure 6:
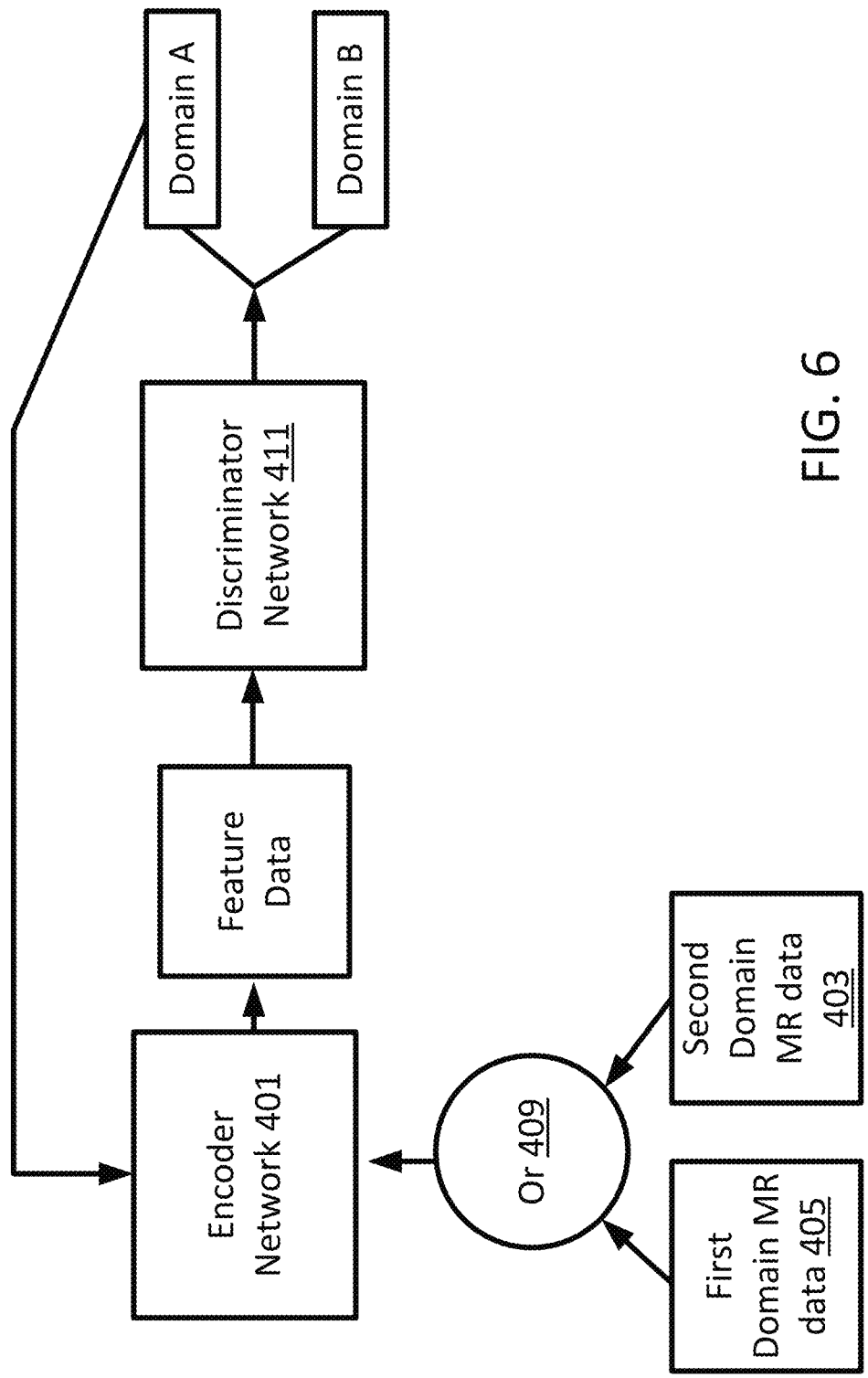
FIG. 6 depicts an example adversarial process for training a machine learnt network.

FIG. 6 depicts an example GAN process. The GAN process uses the training process as a contest between the two separate networks: the encoder network 401 that generates feature data 407 and the discriminator network 411 that attempts to classify the input data as either from Domain A or Domain B. During training, the OR function 409 randomly feeds the encoder network 401 first domain MR data or second domain MR data. The first domain MR data may be considered ground truth data for which the discriminator network 411 attempts to distinguish the data from the second domain. The discriminator network 411 detects a difference and provides feedback to the encoder network 401. Based on the feedback, the encoder network 401 adjusts one or more weights. The information from the discriminator network 411 is backpropagated to the encoder network 401, so the encoder network 401 identifies whether or how to adapt weights in order to generate feature data that may fool the discriminator network 411. At the end of training, the encoder network 401 is able to generate feature data for the second domain that is indistinguishable from feature data from the first domain. During training, the discriminator network 411 may be adjusted in order to get better at distinguishing the two domains.

The discriminator network 411 may use probability distributions or other methods to classify and distinguish between the two domains. The discriminator network 411 provides the information to the encoder network 401. The information provided by the discriminator network 411 may be in the form of a gradient that is calculated as a function of a comparison of the probability distributions of the feature data, e.g. comparing a first probability distribution of values for the first domain with the second domain. The gradient may include both a direction and a slope that steer updates for the generator network 401 in the right direction. After a number of iterations, the gradient directs the generator network 401 to a stable place where the generator network 401 is generating feature data that includes probability distributions that are similar between the two domains. The gradients provided by the discriminator network 411 change as the encoder network 401 generates and provides new feature data. Providing an informative and accurate gradient is key for the training process. If, for example, the discriminator network 411 is too good at distinguishing between the domains, the feedback may not be helpful to the encoder network 401. If the discriminator network 411 is provided with bad feature data or the encoder network 401 does not generate good feature data, the feedback may not be helpful.

During the training process, to avoid or limit one or more of the above referenced issues, the discriminator network 411 provides a gradient calculated using a Wasserstein distance. The Wasserstein distance is a measure of the differences between probability distributions. The Wasserstein value may also be referred to as the earth mover's distance. The two probability distributions may be interpreted as two different ways of piling up a certain amount of dirt over the region D. The earth mover's distance is the minimum cost of turning one pile into the other; where the cost is assumed to be amount of dirt moved times the distance by which it is moved. In another embodiment, the discriminator network provides a gradient calculated using a Cramer distance. Similar to the Wasserstein distance, the Cramer distance is a measure of the differences between probability distributions. The Cramer distance may be a measure of the energy required to transform one distribution into another.

In an embodiment, the adversarial network is based on a denoising autoencoder principle with domain adaptation utilize optimization techniques for faster convergence, and better generated synthetic images such as Wasserstein GAN using a clipping of the network weights, gradient penalization, neural distance net measure. Any optimization focusing on image quality improvement may be applied as well.

The training may be repeated for multiple iterations until the networks reach a convergence or the encoder network 401 is able to generate feature data that is indistinguishable between protocols. The training may be performed prior to the procedure of FIG. 2. At act A110, the encoder network 401 may already be fully trained. The decoder network 402 and encoder network 401 may be trained separately or together.

At act A130, the machine learnt network 400 generates image data 439 from the input MR data 437. The image data 439 may be a synthesized image. The image data 439 may be a segmented image. From the latent space 431 output by the encoder, decoders (one per sequence) synthesize an image to the same source modality, but from features that are going to be protocol robust and therefore to the same distribution. The decoder also uses a fully convolutional dense architecture with deconvolution layers. The number of dense blocks in the decoder may match that of the encoder. The output of each dense encoder block can be propagated to the dense block from the decoder at the same scale level as skip connections. One extension of this framework is that for tasks like synthesis or segmentation that require a latent space 431 for image generation, the domain adapted latent space 431 may be used directly. Otherwise, normalized data may be used if a volume is required for a specific task.

At act A140, a synthesized object is displayed to an operator. The output may be presented to an operator with labels or different colors representing different tissues or points of interest. The output may be two-dimensional or three-dimensional. The output may be color or black and white. The image data and the synthesized image data 439 may be stored for later use.

Figure 7:
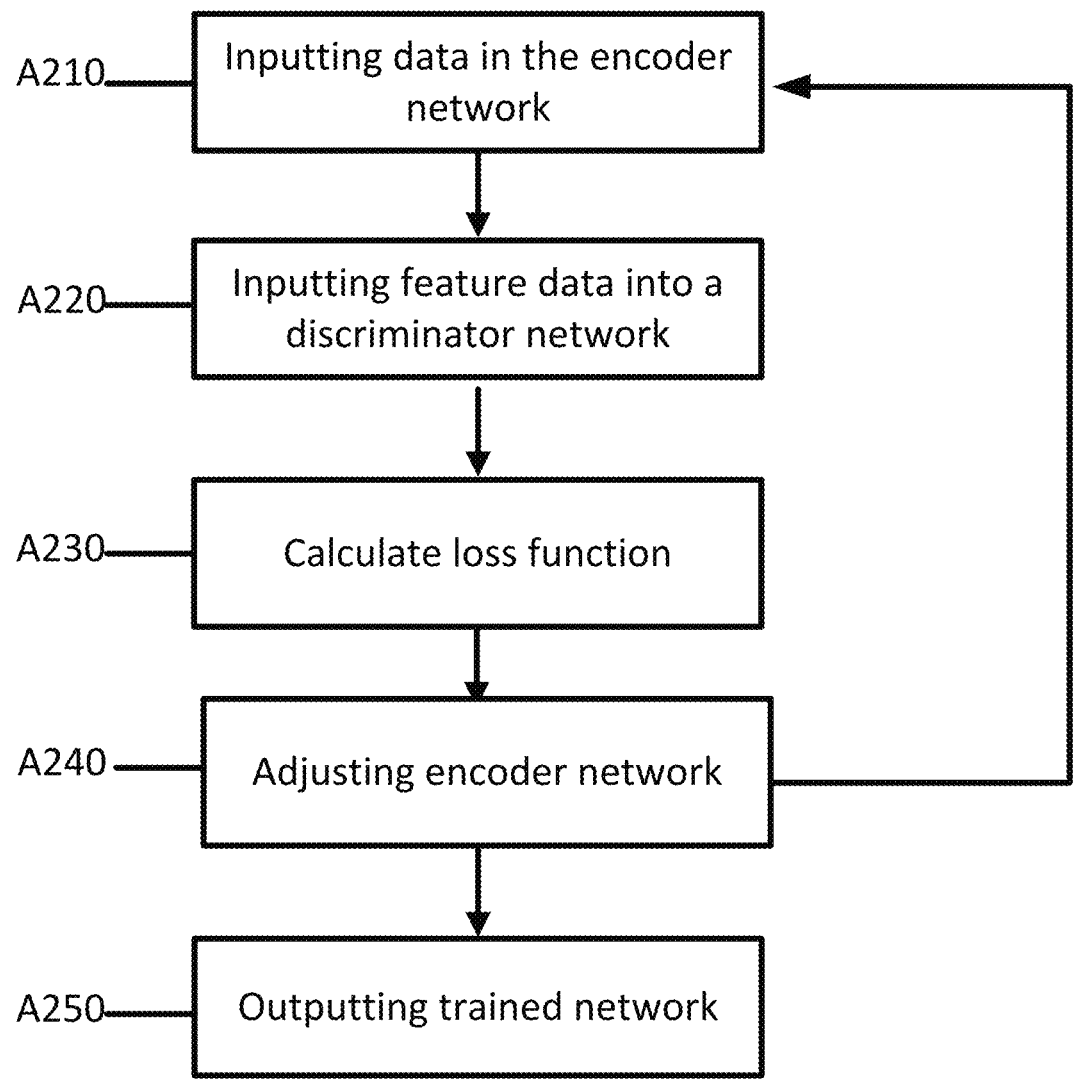
FIG. 7 depicts one embodiment of a method for training a machine network.

FIG. 7 depicts one embodiment of a method for training a machine learnt network 400 for generating a protocol independent feature extraction for MR data. The acts are performed by the system of FIG. 1, FIG. 5, FIG. 8, other systems, a workstation, a computer, and/or a server. The acts are performed in the order shown (e.g., top to bottom) or other orders.

The training is to learn to output an image. Rather than pre-programming the features and trying to relate the features to attributes, the deep architecture of the machine network is defined to learn the features at different levels of abstraction based on an input image data with or without pre-processing. The features are learned to reconstruct lower level features (i.e., features at a more abstract or compressed level). For example, features for reconstructing an image are learned. For a next unit, features for reconstructing the features of the previous unit are learned, providing more abstraction. Each node of the unit represents a feature. Different units are provided for learning different features.

The training may involve many iterations using a set of training data. The many samples in the training data are used to learn to output image data 439 given input MR data. The output image is for spatially distributed locations, such as outputting scalar or display values for 2D or 3D locations. Once trained, the machine learnt network 400 (encoder/decoder) may be applied to generate a segmented image that is invariant to a protocol, sequence, or machine used to acquire the MR data. In other embodiments, the training continues. The machine network is periodically updated. For example, online or other updated learning is performed. As new samples are acquired, the learning is repeated in total or to incorporate the further training data.

At act A210, first data acquired from an MRI system is input into an encoder network 401 of a generator neural network 400. The encoder network 401 is configured to generate a latent space 431 that represents a compact version of the first data (e.g. a feature map or feature data).

In an embodiment, a fully convolutional dense network is used for the generator neural network 400. The fully convolutional dense network includes an independent encoder and an independent decoder. The fully convolutional dense network first includes in an independent encoder that generates a latent space 431, or a compact representation of the input images. The independent encoder 401 is followed by an independent decoder 402 that uses the latent space 431 to get to the specific task of reconstructing the brain and tissue masks. The independent encoder 401 and independent decoder 402 may be symmetrical, using the same number of pooling (downsampling/upsampling) steps and therefore allowing connections between encoding and decoding stages. Between each pooling step, blocks are defined as succession of layers which also use skip connections. The number of layers in each block can be defined and a growth rate is set to increase the number of feature maps for each consecutive layer 435 in a block.

In an embodiment, a convolutional-to-transposed-convolutional network is used. One segment (i.e., encoder) of layers or units applies convolution to increase abstractness or compression. The most abstract feature values are then output to another segment (i.e., decoder). The other segment of layers or units then applies transposed-convolution to decrease abstractness or compression. The encoder (convolutional) and decoder (transposed-convolutional) network forms a "U" shape with one vertical being encoding, another vertical being decoding, and the connection between being passing features at a greatest level of compression or abstractness from the encoder to the decoder. Any now known or later developed U-net architectures may be used. Skip connections, such as passing features at other scales than the greatest compression, may be provided. Other fully convolutional networks may be used.

The machine learnt generator may be configured to perform either synthesis, extraction, and/or segmentation. The independent encoder and independent decoder may be replaced with alternative encoders or decoders depending on the desired result. The independent encoders and decoders are trained separately. The encoders are trained to generate a protocol invariant latent space 431. The decoders are trained to input the latent space 431 and provide a synthesized image.

In an embodiment, the machine learnt generator network is a fully convolutional dense network. The generator includes an encoder that generates a latent space 431, e.g. a compact representation of the input MR data. The latent space 431 includes values that describe distilled features of the input MR data. The generator also includes a decoder that uses the latent space 431 generated by the encoder to reconstruct the object. In an embodiment, the encoder and decoder are symmetrical, using the same number of pooling (downsampling/upsampling) layers. The symmetrical structures provide for connections between encoding and decoding stages referred to as skip connections. The skip connections help against vanishing gradients and help maintain the high frequency components of the images. Between each pooling step, blocks are defined as succession of layers that also use skip connections. The number of layers in each block may be defined and a growth rate set to increase the number of feature maps for each consecutive layer in a block.

At act A220, the latent space 431 (feature data) is input into a discriminator network 411. The discriminator network 411 is configured to classify the feature data as acquired from a first domain or second domain. In an embodiment, a convolutional network structure is used for the discriminator network 411. The discriminator network 411 receives feature data generated by the encoder network 401. The feature data is propagated through a plurality of convolutional layers with for example, the image dimension down and the channel dimension multiplied. Each convolutional layer 435 is followed by rectifiers. The final layer 435 returns a classification label of (0) for feature data from a first domain or (1) for feature data from a second domain. Instead of a binary classification label, the final layer 435 may return a classification score. For example, the score may include a range of 0 to 1 with scores closer to 0 indicating feature data from the first domain and scores closer to 1 indicating feature data from the second domain.

At act A230, a value is calculated based on a loss function for the classification. The loss function may be calculated based on a Wasserstein or Cramer distance. The Wasserstein value is a measure of the distance between two probability distributions over a region. The Wasserstein value may also be referred to as the earth mover's distance. The two probability distributions may be interpreted as two different ways of piling up a certain amount of dirt over the region D. The earth mover's distance is the minimum cost of turning one pile into the other; where the cost is assumed to be amount of dirt moved times the distance by which it is moved.

The competition or adversarial relationship between the encoder network 401 and the discriminator network 411 may be defined by:

$$\min_G \max_D \mathbb{E}_{x \sim \mathbb{P}_r}[\log(D(x))] + \mathbb{E}_{\tilde{x} \sim \mathbb{P}_g}[\log(1 - D(\tilde{x}))], \quad \text{Equation 1}$$

where Pr is the data distribution and Pg is the model distribution implicitly defined by x=G(z), z~p(z) where the input z to the generator network 401 is sampled from some simple noise distribution p, such as the uniform distribution or a spherical Gaussian distribution.

The Wasserstein distance W(q, p), is defined as the minimum cost of transporting mass in order to transform the distribution q into the distribution p (where the cost is mass times transport distance). W(q, p) is continuous everywhere and differentiable almost everywhere. The discriminator value function is constructed using a Kantorovich-Rubinstein duality to obtain:

$$\min_G \max_{D \in \mathcal{D}} \mathbb{E}_{x \sim \mathbb{P}_r}[D(x)] - \mathbb{E}_{\tilde{x} \sim \mathbb{P}_g}[D(\tilde{x})], \quad \text{Equation 2}$$

where the cost function for the discriminator network 411 is the set of 1-Lipschitz functions and Pg is the model distribution implicitly defined by x=G(z), z p(z). Under an optimal discriminator, minimizing the value function with respect to the generator network 401 parameters minimizes W (Pr, Pg). The value function results in a critic function that includes a gradient. The weights of the critic function may be clipped to lie within a compact space. The critic function is calculated using the Wasserstein value and provided to the encoder network 401.

At act A240, the encoder network 401 is adjusted as a function of the calculated value. The discriminator network 411 may also be adjusted. The encoder network 401 is adjusted based on the value provided by the loss function from the discriminator network 411. The discriminator network 411 may also be adjusted as a function of a comparison between input ground truth data and the predicted output. The two networks contest one another, the discriminator network 411 attempts to distinguish feature data between domains, and the generator network 401 attempts to generate image data that confuses the discriminator network 411 into classifying all the images as "ground truth". At the end of training process, the generator network 401 generates feature maps that are indistinguishable between domains.

The acts A210-240 may be repeated until the first and second loss function converge. At act A250, the machine outputs a trained network. The machine-learned network is a neural network incorporating the deep learned features for the various units and/or layers of the network and/or the relationships of input features to the output. The collection of individual features forms a feature or feature set for generating a segmented image from MR data. For a convolutional neural network, the features are provided as nodes of the feature units in different levels of abstraction or compression. The nodes define convolution kernels trained to extract the features. Once trained, a matrix, kernels, or other trained network is output. The machine learned network includes definitions of convolution kernels, links, weights, pooling, and/or other characteristics of the network trained to generate the image from input MR data with or without input metadata and/or auxiliary map. The machine learned detector is output to a network or memory. For example, the neural network as trained is stored in a memory for transfer and/or later application.

Once the network is trained, the trained network may be applied. The trained network with defined or learnt features is used to extract from previously unseen input MR data with or without other inputs (e.g., auxiliary map and/or metadata). The machine-learned network uses extracted features from the MR data with or without other information to generate a latent space 431 that is protocol independent.

Figure 8:
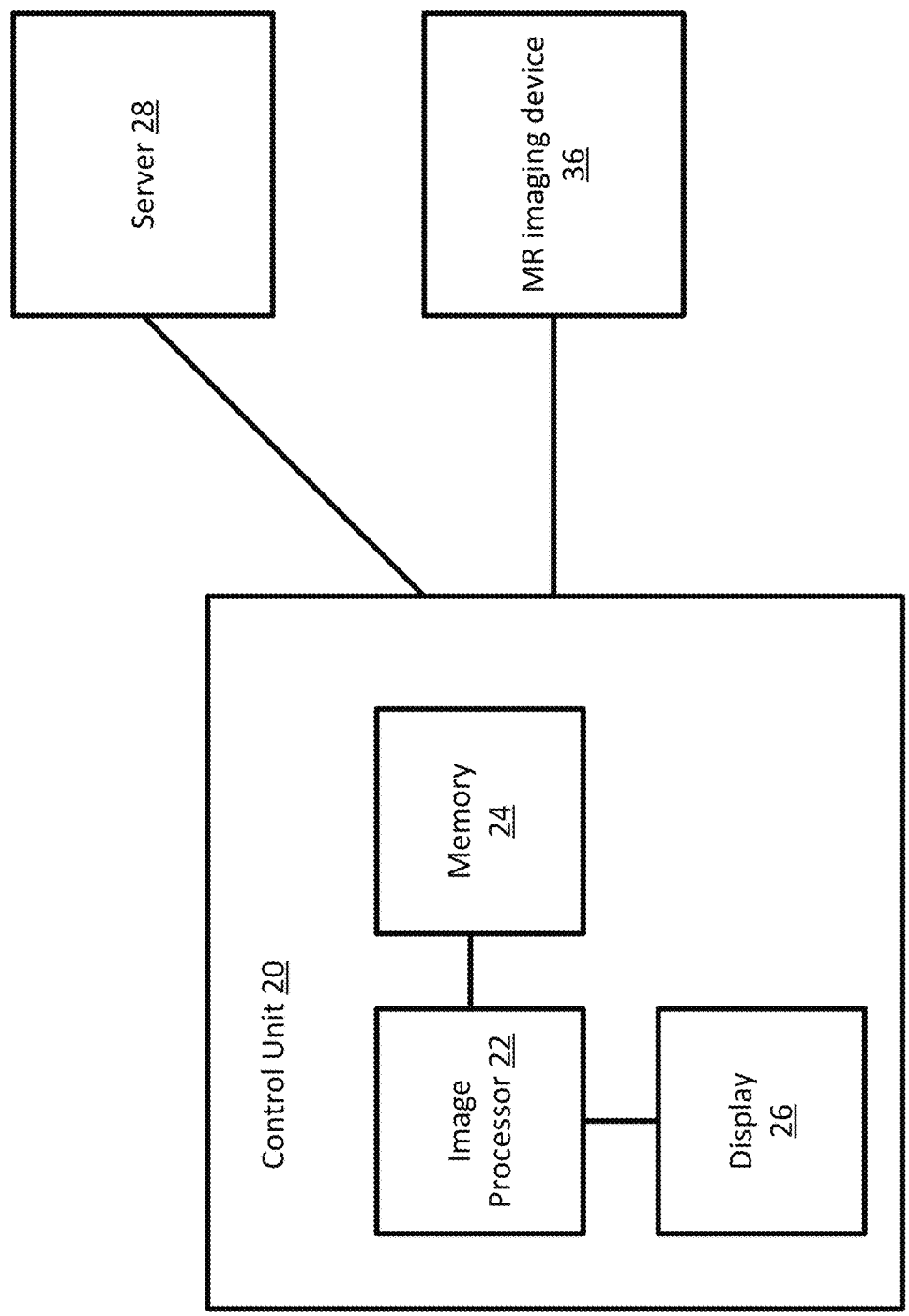
FIG. 8 depicts one embodiment of a control unit for generating protocol invariant segmented images from MR data.

FIG. 8 depicts one embodiment of a control unit for generating standardized medical images from MR data. The control unit includes an image processor 22, a memory 24, and a display 26. The control unit 20 may be connected with a server 28 and an MR imaging device 36. Additional, different, or fewer components may be provided. For example, network connections or interfaces may be provided, such as for networking between the control unit 20 and server 28. A workstation with a user interface may be provided for an operator to input data.

The MR imaging device 36 may be similar to the MR imaging device as depicted in FIG. 1. The MR imaging device 36 is configured to acquire MR data that may be processed into one or more images by the control unit 20. The control unit 20 may provide commands to the MR imaging device 36. Alternatively, the MR imaging device 36 may function entirely on its own without any input from the control unit 20.

The image processor 22 (or processor) is a general processor, central processing unit, control processor, graphics processor, digital signal processor, three-dimensional rendering processor, image processor, application specific integrated circuit, field programmable gate array, digital circuit, analog circuit, combinations thereof, or other now known or later developed device for processing an image. The processor 22 is a single device or multiple devices operating in serial, parallel, or separately. The processor 22 may be a main processor of a computer, such as a laptop or desktop computer, or may be a processor for handling some tasks in a larger system, such as in the MRI system. The processor 22 is configured by instructions, design, hardware, and/or software to perform the acts discussed herein.

The server 28 may be co-located with the control unit 20 or may be located remotely. The server 28 may connect to the MRI system 100 or control unit 20 via a network. The network is a local area, wide area, enterprise, another network, or combinations thereof. In one embodiment, the network is, at least in part, the Internet. Using TCP/IP communications, the network provides for communication between the processor 24 and the server 28. Any format for communications may be used. In other embodiments, dedicated or direct communication is used.

The server 28 may include the processor 24 or group of processors. More than one server 28 or control unit 20 may be provided. The server 28 is configured by hardware and/or software. In one embodiment, the server 28 performs machine learning of the encoder, decoder, and discriminator networks. The server 28 may acquire and the memory 24 may store MR data from multiple different MRI systems.

The processor 24 and/or server 28 are configured to perform the acts discussed above for generating protocol independent images. The processor 24 and/or server 28 may access and implement the code stored in memory 24.

The memory 24 may be a graphics processing memory, a video random access memory, a random-access memory, system memory, cache memory, hard drive, optical media, magnetic media, flash drive, buffer, database, combinations thereof, or other now known or later developed memory device for storing data or video information. The memory 24 is part of the control unit 20, part of a database, part of another system, a picture archival memory, or a standalone device. The memory 24 may store image data from the MRI system. The memory 24 may store an instruction set or computer code configured to implement an encoder network 401, a decoder network, and when training, a discriminator network 411.

The memory 24 includes an instruction set or computer code for implementing the machine learnt networks. In an embodiment, the memory 24 only includes a trained encoder network 401 and decoder network 401. Alternatively, for training, the discriminator network 411 may also be stored in memory 24.

In an embodiment, a deep learning generator is stored in the memory 24 that includes both the trained encoder network 401 and decoder network 401. The deep learning generator includes an initialization layer 435 (or layers) that defines a number of feature maps to start with from the input images directly. The initialization layer 435 may also be a full generative network that is trained with the main brain extraction task, in which case the initialization layer 435 may serve as normalization.

The deep learning generator extracts features from input images and reconstructing the segmentation of the brain and its tissue. The deep learning generator first includes an encoder that generates a latent space 431, or a compact representation of the input images. The encoder is followed by a decoder that uses the latent space 431 to generate a synthesized image. The encoder and decoder are symmetrical, using the same number of pooling (downsampling/upsampling) steps and therefore allowing connections between encoding and decoding stages. Between each pooling step, blocks are defined as succession of layers which also use skip connections. The number of layers in each block may be defined and a growth rate is set to increase the number of feature maps for each consecutive layer 435 in a block. A final layer 435 in the network includes a smoothing layer 435 with a kernel size of one that cleans up the images. To train the deep learning generator, categorical cross-entropy drives the loss to either separate the brain, or the tissues or everything at once.

In an embodiment, an adversarial network is used for domain adaptation. Using the latent space 431 features, a discriminator network 411 is applied to determine out whether the features comes from one domain (one protocol) or another. The optimization drives the discriminator to maximize its loss, and such that it becomes unable to recognize which protocol or domain the data comes from. Training may be done sequentially, with one batch of data with segmentation ground truth with data from original domain and the other one with domain ground truth. The initial domain may be the domain that includes data with the most details, as that domain may be easier to adapt to less detailed acquisition.

In an embodiment, the memory 24 stores a deep fully convolutional dense network of the same type of denoising autoencoders, with Domain Adaptation to minimize differences. The network may be generative (segmentation, synthesis) or discriminative itself (classification). Domains are represented by the same protocols from different institutions. It could be T1w only, or T2w only, or FLAIR only etc. An autoencoder-like architecture is used that includes two parts, an encoder that learns the optimal representation of data from a source modality, under the form of a latent space 431, and a decoder, that uses the said latent space 431 to generate a synthetic image in the same source modality. Encoders, one for each modality, use a Fully Convolutional Dense network. Each encoder includes dense blocks of multiple convolutional layers. Early layers are connected to the next ones within dense blocks. Max or Average Pooling layer follows each dense block to further reduce the scale and advance in the abstract representation of the source data. The number of convolutional layers per dense block may vary depending on the complexity of the source database, so does the number of dense blocks in the encoder, or decoder. The last layer of the encoder defines the latent space 431, where the representation of the data lays in. Inputs to this encoder are source data, that are mostly uni-parametric (CT, PET) but may also represent a standard protocol with multiple sequences (T1w, T2w, FLAIR, Fat, water, in-/opp-phase maps, Diffusion weighted, Perfusion Weighted). The framework based on a denoising autoencoder principle with Domain adaptation utilize optimization techniques for faster convergence, and better generated synthetic images such as Wasserstein GAN using a clipping of the network weights, gradient penalization, neural distance net measure.

The memory 24 or other memory is alternatively or additionally a non-transitory computer readable storage medium storing data representing instructions executable by the programmed processor 22 for generating protocol independent image data 439. The instructions for implementing the processes, methods and/or techniques discussed herein are provided on non-transitory computer-readable storage media or memories, such as a cache, buffer, RAM, removable media, hard drive, or other computer readable storage media. Non-transitory computer readable storage media include various types of volatile and nonvolatile storage media. The functions, acts or tasks illustrated in the figures or described herein are executed in response to one or more sets of instructions stored in or on computer readable storage media. The functions, acts or tasks are independent of the particular type of instructions set, storage media, processor or processing strategy and may be performed by software, hardware, integrated circuits, firmware, micro code, and the like, operating alone, or in combination. Likewise, processing strategies may include multiprocessing, multitasking, parallel processing, and the like.

The display 26 may be configured to display images to an operator. The display 26 may augment the images with additional information or overlays. The display 26 may be configured to display the images in two dimensions, three dimensions, or, for example, in augmented or virtual reality scenarios.

In one embodiment, the instructions are stored on a removable media device for reading by local or remote systems. In other embodiments, the instructions are stored in a remote location for transfer through a computer network or over telephone lines. In yet other embodiments, the instructions are stored within a given computer, CPU, GPU, or system.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

What is claimed is:

1. A method for synthesizing protocol independent magnetic resonance images in a magnetic resonance imaging system, the method comprising:
   scanning a patient by the magnetic resonance imaging system to acquire magnetic resonance data;
   inputting the magnetic resonance data to a machine learnt generator network trained to extract features from input magnetic resonance data and synthesize protocol independent images using the extracted features;
   generating, by the machine learnt generator network, a protocol independent segmented magnetic resonance image from the input magnetic resonance data; and
   displaying the protocol independent magnetic resonance image
   wherein the machine learnt generator network comprises an independent encoder configured to generate a latent space for the input magnetic resonance data and an independent decoder configured to synthesize the protocol independent image from the modality latent space,
   wherein the independent encoder is trained using an adversarial network
   wherein the independent encoder comprises a dense fully convolutional network, and
   wherein the independent encoder is trained by the adversarial network using concatenated features from each dense block output of the dense fully convolutional network, wherein the adversarial network is trained to correctly classify which protocol training data is from.

2. The method of claim 1, wherein the independent encoder is trained on magnetic resonance data from acquired using a single protocol from a plurality of institutions.

3. The method of claim 1 wherein the independent decoder is trained to synthesize an image to the same source modality as the magnetic resonance data.

4. The method of claim 1, wherein the adversarial network is trained using a loss function calculated as a function of a Wasserstein distance.

5. The method of claim 1, wherein the adversarial network is trained using a loss function calculated as a function of a Wasserstein distance.

* * * * *